(12) United States Patent
Tom

(10) Patent No.: US 6,342,401 B1
(45) Date of Patent: Jan. 29, 2002

(54) TEST STRUCTURES FOR SILICON ETCHING

(75) Inventor: Dennis W. Tom, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/772,396

(22) Filed: Jan. 29, 2001

(51) Int. Cl.$^7$ .......................... H01L 21/66; G01R 31/26
(52) U.S. Cl. ........................................................ 438/17
(58) Field of Search ............................... 438/17, 14–16, 438/18, 5–13; 216/13–21, 58, 59

(56) References Cited

U.S. PATENT DOCUMENTS 5,286,656 A * 2/1994 Keown et al. ................. 438/18

* cited by examiner

Primary Examiner—Charles Bowers
Assistant Examiner—Craig Thompson
(74) Attorney, Agent, or Firm—Timothy F. Myers

(57) ABSTRACT

A test structure determines the trench depth from etching in a resistive substrate. The test structure has a first contact and a second contact to the substrate. Between the first and second contact is disposed an etch window. A measurement of resistance between the first contact and the second contact is indicative of the depth of etching in the etch window.

5 Claims, 5 Drawing Sheets

TEST STRUCTURES FOR SILICON ETCHING

FIELD OF THE INVENTION

This invention relates to parametric test structures for integrated circuits, more particularly, this invention relates to a test structure to measure the depth of etching in resistive substrates.

BACKGROUND OF THE INVENTION

Silicon etching is being aggressively pursued in micromachining such as with the fabrication of fluid ejection devices such as ink-jet printheads. During the fabrication of such fluid ejection devices, expensive vision tools or high cost operators are used to monitor and measure the depth of trench etch in silicon or other substrates. Manufacturers have used these visual monitoring techniques even though they are expensive and prone to error, especially when using manual labor. Further, when these visual monitoring techniques are used in high volume operations, fatigue and other human factor issues such as ergonomics must be factored into the process, thereby increasing costs. Unless an approach is found which reduces the human interaction with measuring the trench depth, costs will continue to increase making micro-machining less attractive as a new technology.

SUMMARY

A test structure determines the trench depth from etching in a resistive substrate. The test structure has a first contact and a second contact to the substrate. Between the first and second contact is disposed an etch window. A measurement of resistance between the first contact and the second contact is indicative of the depth of etching of in the etch window.

DETAILED DESCRIPTION OF THE PREFERRED AND ALTERNATE EMBODIMENTS

The increasing quality and performance requirements of fluid ejection applications such as ink-jet printing have produced new micro-machining techniques. One such technique is described in U.S. patent application Ser. No. 08/956,235 entitled "SINGLE-SIDE FABRICATION PROCESS FOR FORMING INKJET MONOLITHIC PRINTING ELEMENT ARRAY ON A SUBSTRATE" filed Oct. 22, 1997 and commonly assigned to the same assignee as the instant application and is herein incorporated by reference. The current application is directed at making etching techniques such as those used in the above referenced application more cost efficient over conventional processes.

Figure 1A:
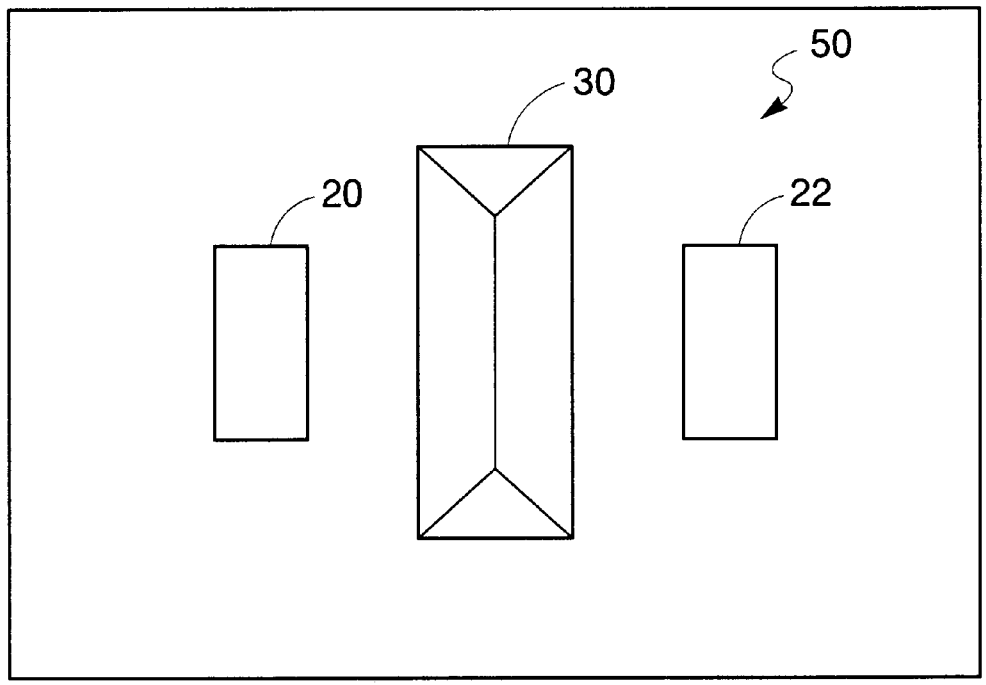
FIG. 1A is a top view of an exemplary test structure which incorporates the invention.

FIG. 1A is a top view of an exemplary test structure 50 which incorporates the invention. In its simplest form, the test structure 50 allows for the determination trench depth created from etching in a substrate 10, preferably silicon but other resistive substrates such as gallium arsenide, or germanium can be used and still meets spirit and scope of the invention, by measuring the resistance between two contacts in the test structure 50 on the substrate 10. An etch window 30 is created between a first contact 20 and a second contact 22 on the substrate 10.

Figure 1B:
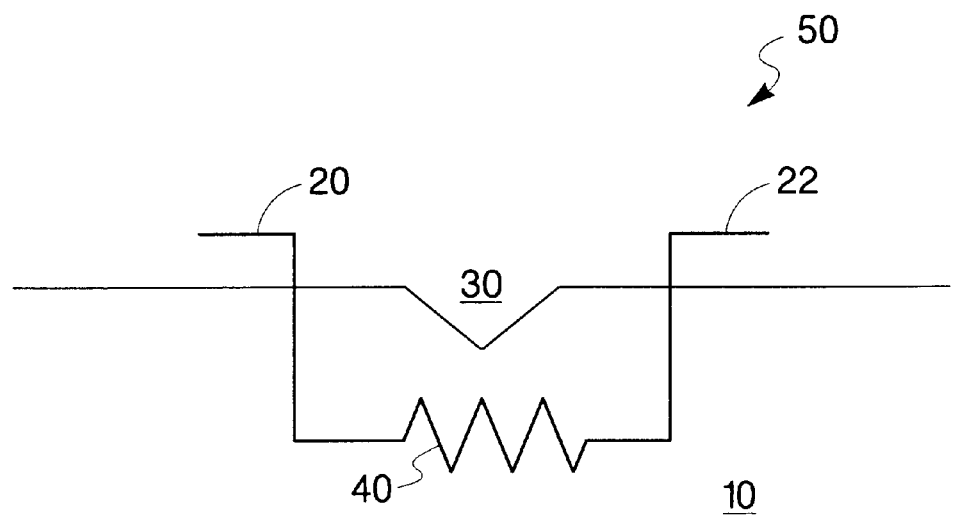
FIG. 1B is a schematic representation of the theory of operation of the invention.

FIG. 1B is a schematic representation of the theory of operation of the invention. Substrate 10 has a bulk resistance 40 that is detected and measured between first contact 20 and a second contact 22. As the etch window 30 is etched during fabrication to create micro-structures such as by dry etching, wet etching, laser or sand drilling, and other trench forming techniques, the bulk resistance 40 measured between first contact 20 and second contact 22 changes and is directly dependent upon the depth of the trench formed in the etch window 30. Etch window 30 is shown in FIG. 1B as a V-shaped groove, although other geometrical shapes such as rectangular, trapezoidal, or semi-spherical can be created during etching and still meet the spirit and scope of the invention.

Figure 2A:
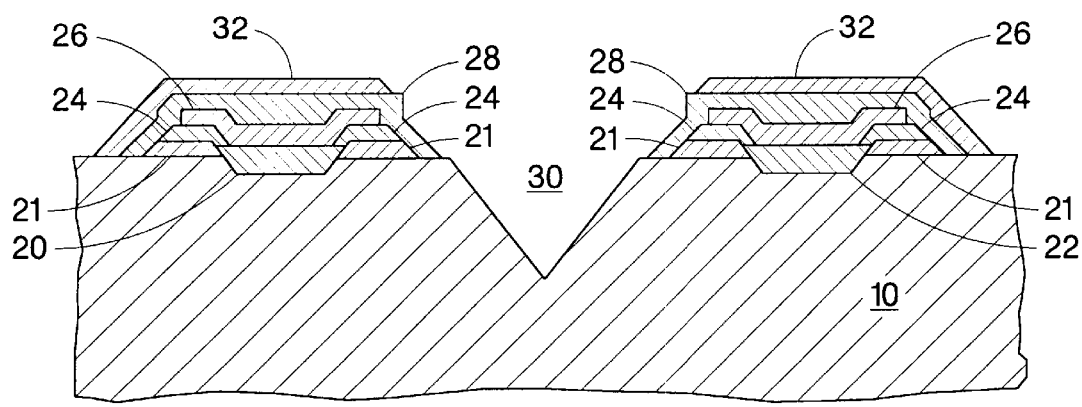
FIG. 2A is an exemplary cross sectional illustration of one embodiment of the invention.

FIG. 2A is a cross sectional view of a substrate 10 processed with exemplary thin-film layers to create the test structure of the invention. In this example, substrate 10 is a P- doped silicon substrate 10. A field oxide layer 21 is typically grown over the surface of the substrate 10. Openings in the field oxide are created and doped with P+ diffusions to form first contact 20 and second contact 22 to make ohmic contact to the substrate 10. A first insulative layer 24, such as phosphosilicate glass is then applied to the substrate 10 and openings in it are created so that a subsequent deposition of metal layer 26 contacts the first contact 20 and second contact 22. Over the metal layer 26 is typically formed a second insulative layer 28, such as TEOS through which openings are formed to connect subsequent metal layers with the metal layer 26. Finally, over the entire substrate surface a passivation layer 32 is applied to prevent contaminants and other harmful material reaching the processed thin-film layers. Openings are formed in the passivation layer such as in the etch window 30 to allow for etching of a trench as shown. Together, the second insulative layer 28 and passivation layer 32 provide protection of the metal layers during etching of the substrate 10.

Figure 2B:
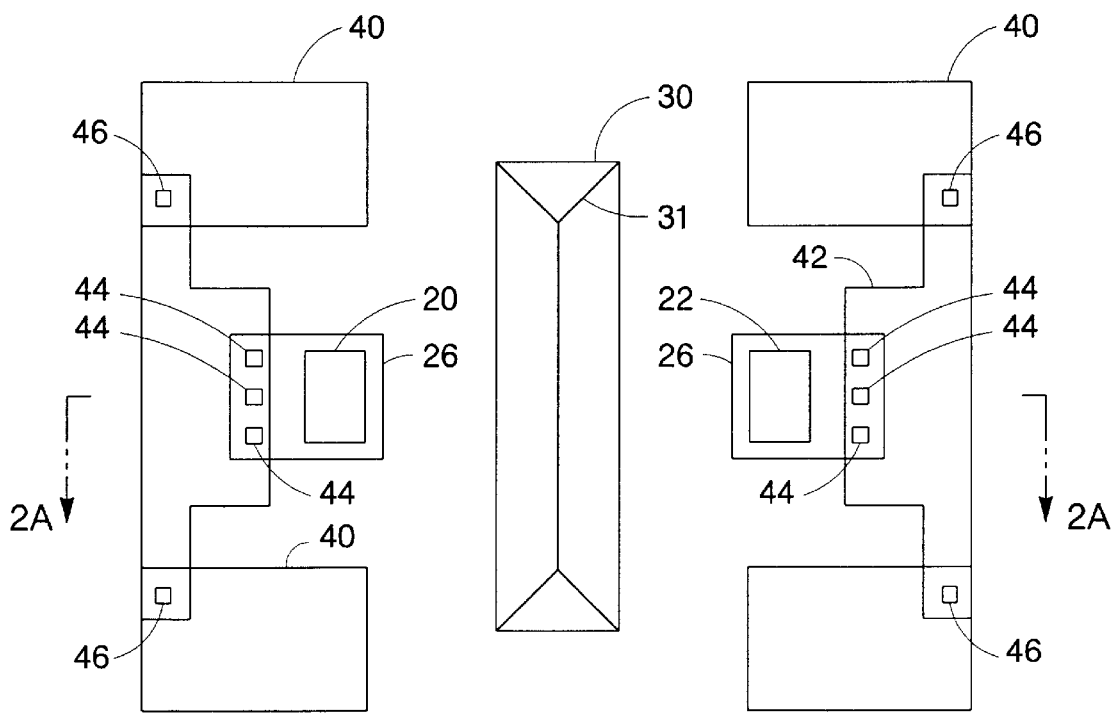
FIG. 2B is a top view of an alternative embodiment of the invention and its fabrication using conventional integrated circuit masks.

FIG. 2B is a top view of an exemplary mask set used to create an alternative embodiment of the invention. In this embodiment, four contacts are used in a four terminal measurement technique to help reduce parasitic noise and resistance created in the test leads that contact test pads 40. In this example, the etch window 30 is an opening in the second insulative layer. The dashed lines 31 illustrate the resulting V-groove etch formed when performing such etching in a <100> crystal oriented silicon substrate with a TEOS solution. First contact 20 and second contact 22 form masks for the P+ diffusion and are connected to a second metal layer 42 with first metal layer 26 using a first set of vias 44. The second metal layer 42 connects to the test pads 40 using a second set of vias 46.

The test structures detect etch depth by measuring a change in resistance between test pads. When the substrate has not been etched, the resistance between the test pads will have a first resistance. When the substrate is etched, the path that current must flow through is essentially lengthened as the etch window has an increasing channel depth. For instance, generally the resistance measured, R, is proportional to the resistivity of the substrate, $\rho$, the length of current flow between the first and second contacts, l, and inversely proportional to the cross-sectional area, A, in which the current flows such that $$R = \rho \frac{l}{A}.$$

For a non-etch substrate, A is equal to the product of the depth, $\lambda$, where the electric field flux is concentrated and the width, w, where the electric field flux is concentrated between the first and second contacts. Therefore, by varying the path that the electric field flux will pass through, a change in resistance will occur. The relationship governing the change of resistance is given by the generalized form of Ohm's law, $$\vec{J} = \frac{\vec{E}}{\rho},$$

where $\vec{J}$ is the current density, $\vec{E}$ is the electric field and $\rho$ is the resistivity of the substrate.

Figure 3A:
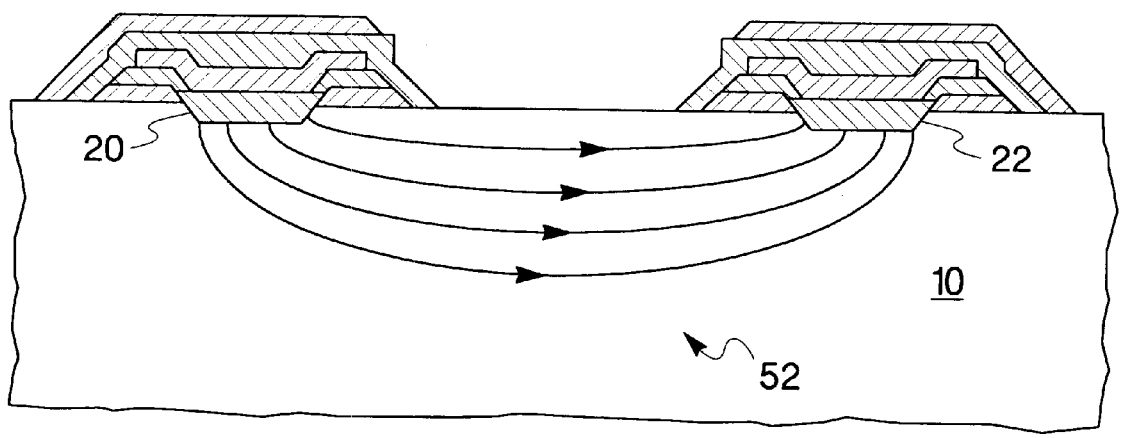
FIG. 3A is an exemplary illustration of electric fields formed in the substrate when no trench etching has occurred.
Figure 3B:
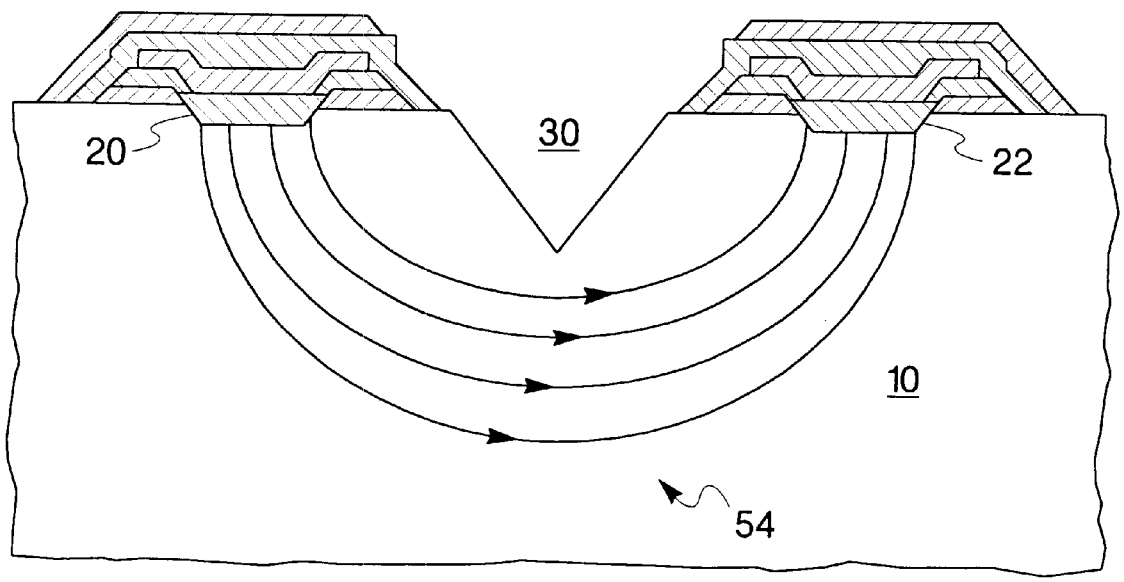
FIG. 3B is an exemplary illustration of electric fields formed in the substrate when trench etching has occurred.

For example, FIGS. 3A and 3B illustrate the change of length l of the electric field for a non-etched and an etched substrate. FIG. 3A illustrates the electric field lines 52 flowing from first contact 20 to second contact 22 in substrate 10 when there is no intervening etched structure. FIG. 3B illustrates the increased length l of the electric field lines 54 in substrate 10 between first contact 20 and second contact 22. The increased length of travel is due to the electric field 54 avoiding the channel formed in etch window 30. Accordingly, as the length increases the resistance measured between the first and second contacts increases in direct proportion.

Figure 4A:
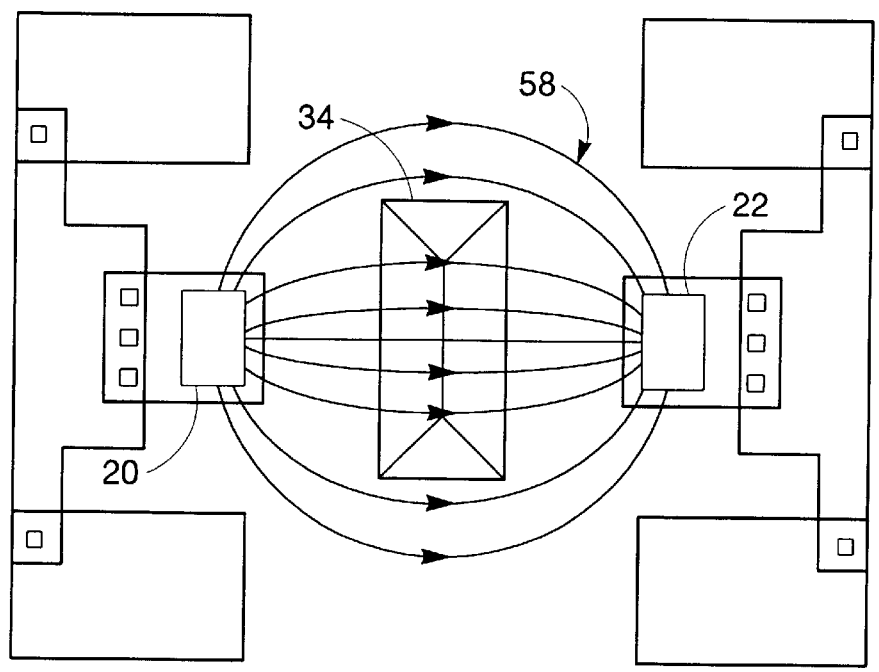
FIG. 4A is a top view of a non-optimum test structure and the resulting electric fields created in the substrate.
Figure 4B:
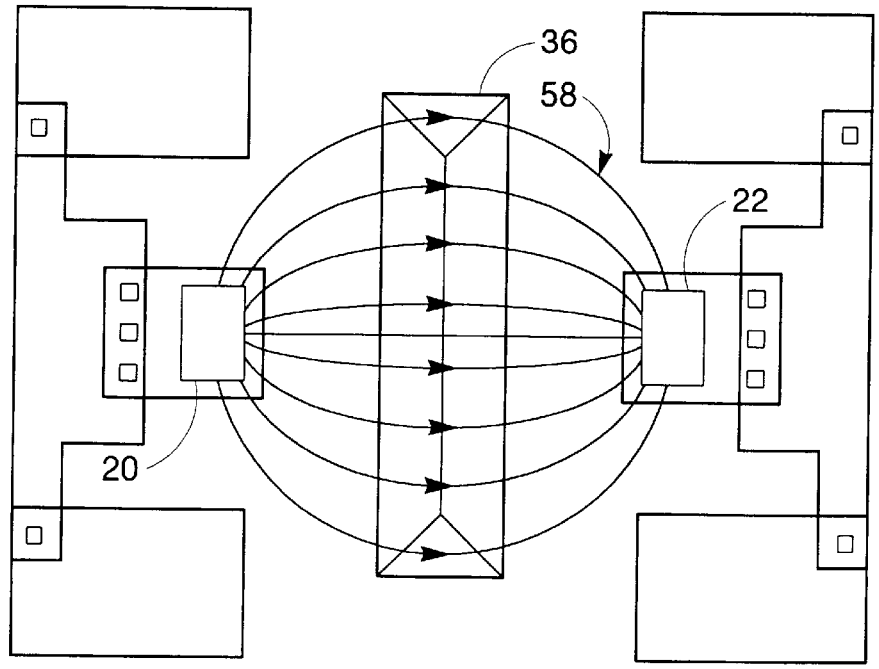
FIG. 4B is a top view of an exemplary test structure and the resulting electric fields created in the substrate.

FIGS. 4A and 4B illustrate a top view of the test structure of FIG. 2B showing the width of the electric field flux flowing from first contact 20 to second contact 22 for differing lengths of etch windows. In FIG. 4A, a sub-optimal etch window 34 having a short length is used such that a portion of the electric field flux 56 flows around the sub-optimal etch window 34. Thus, to ensure that most of the electric field flux passes beneath the etched structure of the etch window, the length of the etch window must be sufficient to prevent the electric field from traversing or creeping around the length of the etch structure. FIG. 4B illustrates a top view of a test structure incorporating a sufficient etch window 36 having a length sufficiently longer than the contact width to force the electric field 58 under the etch trench to yield a predictable electrical relationship between the trench depth and the resistance value.

Figure 5:
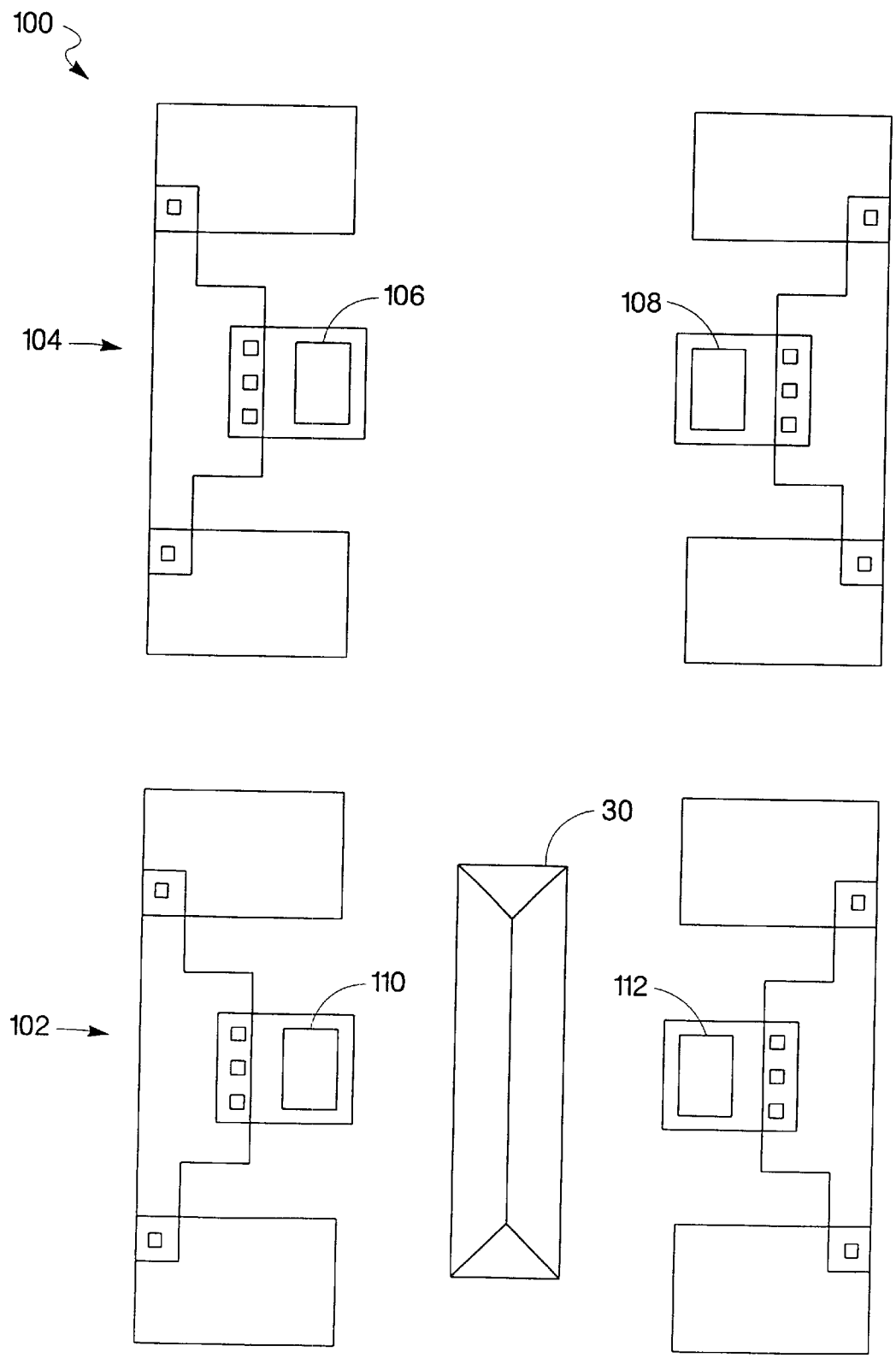
FIG. 5 is a top view of an exemplary normalized test structure.

FIG. 5 is an exemplary embodiment of a normalized test structure 100 having a first test structure 102 in which the etch window 30 is exposed to allow for a channel to be etched and a second test structure 104 in which there is no etch window or the etch window is masked to prevent a channel from being etched. The purpose of the normalize test structure 100 is that by being adjacent to one another, the doping received by each test structure during processing of the substrate through various thin-film steps is substantially the same. Thus, the resistivity of the substrate is substantially the same and a ratio of the resistance of the two test structures provides an indication of the channel depth that is essentially only related to the depth of the etched trench in the first test structure. Accordingly, varying substrate resistivity from wafer to wafer can be factored out. Thus, when testing to see if a predetermined value is reached, the predetermined value will be less susceptible to process and test setup variations.

For example, for the V-groove etch, the ratio between $R_{etch}$ (the resitance between first contact 110 and second contact 112) and $R_{non-etch}$ (the resistance between third contact 106 and fourth contact 108) is $$\frac{R_{etch}}{R_{non-etch}}.$$

To measure the depth of an etch, the first test structure 102 would be measured to read a first resistance ($R_{etch}$) between first contact 110 and second contact 112 where the etch window 30 has been etched. Optionally, a four-wire technique can be used to eliminate lead resistance and noise as described previously. The second test structure 104 is measured to read a second resistance ($R_{non-etch}$) between third contact 106 and fourth contact 108 where no etching of the substrate has occurred. The value of the ratio of the first resistance to the second resistance or the value of the difference between the first resistance and the second resistance can be compared to a predetermined amount to decide if sufficient etching of the substrate has occurred.

Thus, the overall steps for micro-machining a trench in a substrate requires several steps. One step is to create at least one test structure on the substrate for measuring the resistance across an etch window in the test structure. Another step is to actually etch the substrate to form the trenches within the substrate, including the trench in the etch window of the at least one test structure. After the etching step is finished, the resistance across the etch window is measured. Then based on determining if a predetermined resistance has not been exceeded (because the trench depth is not sufficient), returning the substrate back to the fabrication process to continue etching. When this subsequent etching is completed, the resistance across the etch window can be re-measured and if the predetermined resistance is exceeded, then the etching of the substrate is completed. Also, if the measurement from the resistance exceeds a second predetermined value, the wafer can be rejected as the trench has been detected and determined to be etched too deep.

The description of several parametric test structures for determining the depth of etching of a substrate and their use has been described and explained. The invention provides numerous advantages over the visual techniques of the current art, especially in high volume manufacturing. Additionally, the invention can be used in conjunction with or in replacement of the existing visual processes as required to provide precision micro-machining of channel structures in resistive substrates. By replacing the visual inspection process, lower costs for manufacturing and accordingly part cost are achieved. Although several embodiments have been shown and described, the invention is only limited by the appended claims.

What is claimed is:

1. A method of testing the depth of an etch in a resistive substrate, comprising the steps of:

measuring a first test structure to measure a first resistance between a first and second contact wherein an area between the first and second contact has been etched in the resistive substrate;

measuring a second test structure to measure a second resistance between a third and fourth contact wherein an area between the third and fourth contact has an etch window that has not been etched; and determining if a value calculated using the first and second resistance is greater than a predetermined amount.

2. The method of claim 1 wherein the value is determined by taking the ratio of the first resistance and the second resistance.

3. The method of claim 1 wherein the value is determined by using the difference between the first resistance and the second resistance.

4. A method for micro-machining a trench, comprising the steps of:

creating a test structure on a substrate to measure the resistance across a etch window;

etching the substrate to form trenches within the substrate;

measuring the resistance of the across the etch window;

determining if a first predetermined resistance has been exceeded; and if not, continuing the steps of etching, measuring, and determining until the first predetermined resistance has been exceeded.

5. The method of claim 4, further comprising the step of rejecting a substrate if the measured resistance exceeds a second predetermined resistance.

* * * * *

UNITED STATES PATENT AND TRADEMARK OFFICE
CERTIFICATE OF CORRECTION

PATENT NO.     : 6,342,401 B1
DATED          : January 29, 2002
INVENTOR(S)    : Tom It is certified that error appears in the above-identified patent and that said Letters Patent is hereby corrected as shown below:

Title page,
Item [54], Title, please delete "TEST STRUCTURES FOR SILICON ETCHING" and insert therefor -- METHOD FOR MICRO-MACHINING A TRENCH --.

Signed and Sealed this

Tenth Day of May, 2005

JON W. DUDAS
*Director of the United States Patent and Trademark Office*